US011628445B2

(12) United States Patent
Cai et al.

(10) Patent No.: US 11,628,445 B2
(45) Date of Patent: Apr. 18, 2023

(54) MATERIAL CRUSHING CAVITY STRUCTURE AND METHOD FOR DESIGNING A MULTI-STAGE NESTED MATERIAL CRUSHING CAVITY STRUCTURE

(71) Applicant: JIANGXI UNIVERSITY OF SCIENCE AND TECHNOLOGY, Ganzhou (CN)

(72) Inventors: Gaipin Cai, Ganzhou (CN); Chunsheng Gao, Ganzhou (CN); Zhihong Jiang, Ganzhou (CN); Guohu Luo, Ganzhou (CN)

(73) Assignee: JIANGXI UNIVERSITY OF SCIENCE AND TECHNOLOGY, Ganzhou (CN)

( * ) Notice: Subject to any disclaimer, the term of this patent is extended or adjusted under 35 U.S.C. 154(b) by 454 days.

(21) Appl. No.: 16/842,817

(22) Filed: Apr. 8, 2020

(65) Prior Publication Data

US 2020/0324295 A1 Oct. 15, 2020

(30) Foreign Application Priority Data

Apr. 9, 2019 (CN) ......................... 201910280968.7

(51) Int. Cl.
*B02C 2/00* (2006.01)
*B02C 2/02* (2006.01)
(Continued)

(52) U.S. Cl.
CPC .................................... *B02C 2/005* (2013.01)

(58) Field of Classification Search
CPC ............. B02C 2/00; B02C 2/005; B02C 2/02; B02C 2/04
(Continued)

(56) References Cited

U.S. PATENT DOCUMENTS 2,970,783 A * 2/1961 Cheyette ................. B29C 70/12 241/300
3,312,404 A * 4/1967 Allen ...................... B02C 2/045 241/215
(Continued)

FOREIGN PATENT DOCUMENTS

CN 101770038 A 7/2010
CN 202343239 U 7/2012
(Continued)

OTHER PUBLICATIONS

English translate (CN203018122U), retrieved date Aug. 7, 2022.*
English translate (CN206415156U), retrieved date Aug. 7, 2022.*
English translate (JPH06233944A), retrieved date Dec. 1, 2022.*

*Primary Examiner* — Shelley M Self
*Assistant Examiner* — Mohammed S. Alawadi
(74) *Attorney, Agent, or Firm* — WPAT, PC

(57) ABSTRACT

The embodiments of the present invention provide a crushing cavity structure for the technical field of crushing cavities of cone crushing equipment. The crushing cavity structure comprises: a first crushing cavity structure for through-crushing an input material having a first material characteristic, the first crushing cavity structure has a first crushing cavity and a first lining plate structure that match the first material characteristic, and the first crushing cavity and the first lining plate structure form a first-stage material crushing channel; a second crushing cavity structure for through-crushing a first-stage material having a second material characteristic, the first-stage material is obtained by the input material passing through the first-stage material crushing channel, the second crushing cavity structure has a second crushing cavity and a second lining plate structure that match the second material characteristic, and the second crushing cavity and the second lining plate structure form a second-stage material crushing channel.

10 Claims, 3 Drawing Sheets

(51) Int. Cl.
*B02C 25/00* (2006.01)
*G06F 30/20* (2020.01)

(58) Field of Classification Search
USPC .......................................................... 241/207
See application file for complete search history.

(56) References Cited

U.S. PATENT DOCUMENTS

| | | | | | |
|---|---|---|---|---|---|
| 3,536,267 | A * | 10/1970 | Schmitz | B02C 2/005 241/293 |
| 3,797,760 | A * | 3/1974 | Davis | B02C 2/045 241/290 |
| 5,184,389 | A * | 2/1993 | Dean | B02C 2/005 29/467 |
| 6,036,129 | A * | 3/2000 | Ambrose | B02C 2/04 241/210 |
| 6,065,698 | A * | 5/2000 | Karra | B02C 2/047 241/207 |
| 6,129,297 | A * | 10/2000 | Sawant | B02C 2/005 241/207 |
| 6,213,418 | B1 * | 4/2001 | Gabriel | B02C 2/04 241/210 |
| 2004/0035967 | A1 * | 2/2004 | Johnson | B02C 2/005 241/207 |
| 2014/0361106 | A1 * | 12/2014 | Biggin | B02C 2/04 241/207 |
| 2017/0131192 | A1 | 5/2017 | Perez | |
| 2019/0232298 | A1 * | 8/2019 | Juhlin | B02C 2/045 |
| 2020/0230609 | A1 * | 7/2020 | Eisner | B02C 2/06 |

FOREIGN PATENT DOCUMENTS

| | | | | | |
|---|---|---|---|---|---|
| CN | 103018338 | A | | 4/2013 | |
| CN | 203018122 | U | * | 6/2013 | |
| CN | 203018122 | U | | 6/2013 | |
| CN | 103521289 | A | | 1/2014 | |
| CN | 105260575 | A | | 1/2016 | |
| CN | 205379921 | U | | 7/2016 | |
| CN | 205599216 | U | | 9/2016 | |
| CN | 206415156 | U | * | 8/2017 | |
| CN | 207254381 | U | | 4/2018 | |
| CN | 109409568 | A | | 3/2019 | |
| JP | 06233944 | A | * | 8/1994 | B02C 2/04 |

* cited by examiner

MATERIAL CRUSHING CAVITY STRUCTURE AND METHOD FOR DESIGNING A MULTI-STAGE NESTED MATERIAL CRUSHING CAVITY STRUCTURE

CROSS REFERENCE TO RELATED APPLICATIONS

This application claims priority to Chinese Application No. 201910280968.7, filed on Apr. 9, 2019, entitled "Material Crushing Cavity Structure and Method for Designing a Multi-Stage Nested Material Crushing Cavity Structure", which is specifically and entirely incorporated by reference.

FIELD OF THE INVENTION

The present invention relates to the technical field of crushing cavities of cone crushing equipment, particularly to a material crushing cavity structure, a multi-stage nested material crushing method, and a method for designing a multi-stage nested material crushing cavity structure.

BACKGROUND OF THE INVENTION

The working mechanism of a cone crusher consists of a crushing wall and a rolling mortar wall, wherein the crushing wall is mounted eccentrically in the middle of the rolling mortar wall via a main shaft in it, and the crushing wall can oscillate with respect to the rolling mortar wall. In the swing process, the crushing wall crushes the material in the crushing cavity so that the particle diameter of the ore is decreased continuously, till the material is crushed to a specific particle diameter and then discharged out of the crushing cavity.

At present, the crushers used in the crushing industry in China are mainly categorized into two categories, one category of crushers are traditional spring cone crushers, which utilize a moving cone to obtain large displacement and great crushing force for pressing and crushing materials. These crushers have low crushing efficiency because the rotation speed of the moving cone is low and the crushing cavity is a conventional inverted cone cavity structure. The other category of crushers are imported crushers, represented by Sandvik and Metso crushers, which have high installed capacity, employ a moving cone operating at a high rotation speed, and employ a laminating crushing cavity structure. Therefore, these crushers have high crushing efficiency, but the lining plate is worn quickly, and the operating cost of the equipment is severely increased.

The crushing capacity and discharging granularity of a cone crusher are closely related with the geometric structure of the crushing cavity and the geometric structure of the crushing wall and rolling mortar wall. The consistency of crushing cavity shape in early stage and late stage and the service life of the crushing wall and rolling mortar wall are related with the structure of the crushing cavity, geometric structure of the lining plate, and material composition of the lining plate.

At present, conical crushing cavities are mainly designed into V-shaped crushing cavities, with the working face of the lining plate in a simple shape, according to coarse crushing, medium crushing, and fine crushing granularities and crushing ratios of the fed material, under a condition that the angle of engagement doesn't exceed 25°. Owing to the fact the ore is detained in such a crushing cavity for a short time and is subjected to a simple load, the material can't be crushed selectively. Moreover, the crushing load is higher and the lining plate is worn more quickly at a position nearer the bottom of the crushing cavity. Therefore, since the lining plates are made of a high manganese steel alloy material solely at present, the shape of the crushing cavity will change quickly in the early stage and late stage of use of the lining plate.

Patents with the technique in the present invention mainly include:

The Chinese Patent Document No. 201620415439.5 titled as "Shape of Crushing Cavity of Cone Crusher" has disclosed a (semi-)stepped shape of crushing cavity of cone crusher, in which the working face of a fixed cone lining plate is a smooth conical surface. While the working face of a moving cone lining plate is designed with several stepped structures, and thereby the obtained crushing cavity is in a (semi-)stepped structure. Compared with the traditional V-shaped crushing cavities, the lining plate of such a crushing cavity is subject to uniform wearing, and the quality of the crushed product and the crushing efficacy are improved. However, since steps are arranged only on the working face of the moving cone lining plate, only the descending speed of the material in the crushing cavity is decreased, but the angle of engagement of the stepped cavities is not adjusted. Consequently, it is difficult to give full play to the laminating crushing effect.

The Chinese Patent Document No. 201210406843.2 titled as "Cone Crusher" has disclosed a crushing cavity of crusher, which comprises an upper preparation area for uniform material feeding and a lower crushing parallel area, wherein the angle of engagement of the preparation area is zero. And annular cellular cavities are distributed regularly in the working conical surfaces of the fixed cone lining plate and the moving cone lining plate in the parallel area. The cellular cavities can realize crushing of individual material particles and crushing of material layer, and thereby can improve the proportion of fine size-grade product, reduce the abrasion of the lining plate, and reduce the weight of the lining plate. However, the cross sectional shape and size of the cellular cavities in the working conical surface of the lining plate have great influence on the crushing effect and the service life of the lining plate.

The Chinese Patent Document No. 201120476948.6 titled as "Shape of Crushing Cavity of Cone Crusher" has disclosed a crushing cavity formed by a fixed cone lining plate with a curved generatrix of working face and a moving cone lining plate with a linear generatrix of working face, with a large included angle (10-20°) between the axis of the fixed cone lining plate and the moving cone lining plate. Owing to the fact that the moving cone lining plate has a large angle of oscillation, high crushing force can be generated, and the crusher is suitable for coarse crushing, but the size-grade distribution of the crushed product is wide.

The Chinese Patent Document No. 201220695220.7 titled as "Lining Plate Structure of Cone Crusher" has disclosed a (semi-)stepped shape of crushing cavity of cone crusher, in which the working face of a fixed cone lining plate is a smooth conical surface. While the working face of a moving cone lining plate is designed with several stepped structures, and thereby the obtained crushing cavity is in a (semi-) stepped structure. Compared with the traditional V-shaped crushing cavities, the lining plate of such a crushing cavity is subject to uniform wearing, and the quality of the crushed product and the crushing efficacy are improved. However, owing to the fact that the shape of working face of the moving cone lining plate is simple and the working face at the lower part is worn quickly, the cavity shape near the bottom of the crushing cavity is changed severely in the late stage of the service life of the lining plate, resulting in a compromised crushing effect.

Based on the above analysis, none of the disclosed patented techniques related with cone crushing cavity and lining plate structure presently involve the content of the present invention. Therefore, a technical design method for developing multi-gradient nested laminating crushing cavity and lining plate structure to improve the crushing efficacy and prolong the service life of the lining plate is a technical problem to be solved by those skilled in the art.

CONTENT OF THE INVENTION

The objects of the embodiments of the present invention are to provide a material crushing cavity structure, a multi-stage nested material crushing method, and a method for designing a multi-stage nested material crushing cavity structure. Which aims to solve the technical problems of poor efficacy and severe abrasion caused by the failure to take into account material characteristic changes in the crushing process in the prior art.

The technical scheme of the present invention is as follows:

A material crushing cavity structure, comprising:

a first crushing cavity structure for through-crushing an input material having a first material characteristic, the first crushing cavity structure has a first crushing cavity and a first lining plate structure that match the first material characteristic, and the first crushing cavity and the first lining plate structure form a first-stage material crushing channel;

a second crushing cavity structure for through-crushing a first-stage material having a second material characteristic, the first and second stage material is obtained by the input material passing through the first-stage material crushing channel, the second crushing cavity structure has a second crushing cavity and a second lining plate structure that match the second material characteristic, and the second crushing cavity and the second lining plate structure form a second-stage material crushing channel;

wherein, the first-stage material crushing channel and the second-stage material crushing channel form a continuous material crushing channel.

Optionally, the material crushing cavity structure further comprises:

a third crushing cavity structure for passing through a second-stage material having a third material characteristic to obtain a crushed output material, the second-stage material is obtained by the first-stage material passing through the second-stage material crushing channel the third crushing cavity structure has a third crushing cavity and a third lining plate structure that match the third material characteristic, and the third crushing cavity and the third lining plate structure form a third-stage material crushing channel;

wherein, the third-stage material crushing channel and the continuous material crushing channel form a multi-stage continuous material crushing channel.

Optionally, the first crushing cavity structure employs a laminating crushing cavity structure.

Optionally, the second crushing cavity structure and/or the third crushing cavity structure employ a laminating crushing cavity structure.

Optionally, the second lining plate structure or the third lining plate structure is arranged in the first lining plate structure and form a nested crushing cavity structure together with the first lining plate structure, and the second crushing cavity or the third crushing cavity is different from the first crushing cavity in terms of the cavity size.

Optionally, the second lining plate structure and the third lining plate structure are arranged in the first lining plate structure sequentially, and form a multi-stage nested crushing cavity structure together with the first lining plate structure, any one of the second crushing cavity and the third crushing cavity is different from the first crushing cavity in terms of the cavity size, and the second crushing cavity and the third crushing cavity are different from each other in terms of the cavity size.

Optionally, the first lining plate structure comprises a fixed cone lining plate and a moving cone lining plate;

the working faces of the fixed cone lining plate and the moving cone lining plate are stepped curve faces, and form an upper laminating crushing cavity, a middle laminating crushing cavity, and a lower laminating crushing cavity, the sizes of which are reduced sequentially, with respect to the position of the input material;

the upper laminating crushing cavity, the middle laminating crushing cavity, and the lower laminating crushing cavity form the first crushing cavity.

Optionally, the second lining plate structure comprises a concave-convex lining plate structure formed by arranging concave-convex structures on the working faces of the fixed cone lining plate and the moving cone lining plate in the first crushing cavity;

the concave-convex lining plate structure forms an upper nested second-stage laminating crushing cavity, a middle nested second-stage laminating crushing cavity, and a lower nested second-stage laminating crushing cavity, the sizes of which are reduced sequentially, corresponding to the upper laminating crushing cavity, the middle laminating crushing cavity, and the lower laminating crushing cavity;

the upper nested second-stage laminating crushing cavity, the middle nested second-stage laminating crushing cavity, and the lower nested second-stage laminating crushing cavity form the second crushing cavity.

Optionally, the concave-convex structure comprises:

concave grooves, which extend along the generatrix of the conical surface of the fixed cone lining plate or the moving cone lining plate, and have constant groove width;

convex cones, which are arranged in alternate with the concave grooves;

wherein the groove depth of the concave grooves varies from deep to shallow with respect to the working faces of the convex cones along the displacement vector direction of the input material;

wherein in the longitudinal cross section of a selected moving cone lining plate or fixed cone lining plate, the symmetrical central planes of the concave grooves are at a spiral angle with respect to the generatrix of the conical surface of the current lining plate, the rotation direction of the spiral angle is the same as the rotation direction of the moving cone lining plate;

wherein the working faces of the convex cones are arranged in a spiral sector shape along the displacement vector direction of the input material.

Optionally, the third lining plate structure comprises:

concave wedge grooves arranged on a parallel working face of the moving cone lining plate relative to the fixed cone lining plate.

Optionally, the concave wedge grooves are uniformly distributed in the parallel working face of the moving cone lining plate with respect to the fixed cone lining plate at an even angular interval.

Optionally, the concave wedge grooves are linear wedge structures along the generatrix of the conical surface of the moving cone lining plate, the groove depth of the concave wedge groove varies from deep to shallow along the displacement vector direction of the input material, and the concave wedge grooves are in an arc wedge shape in the circumference direction perpendicular to the generatrix of the conical surface of the moving cone lining plate.

Optionally, the concave wedge groove comprises a linear section, an outer arc section, and an inner arc section with respect to an inner cavity wall of the third crushing cavity in the parallel working face, and the groove depths of the linear section, the outer arc section, and the inner arc section are distributed in a shallow-to-deep form in the circumferential rotation direction perpendicular to the generatrix of the conical surface of the moving cone lining plate.

A multi-stage nested material crushing method, comprising the following steps:

S1) selecting a first crushing cavity structure according to the material characteristics of an input material, and feeding the input material through the first crushing cavity structure to obtain a first-stage material;

S2) selecting a second crushing cavity structure according to the material characteristics of the first-stage material, nesting the second crushing cavity structure in the first crushing cavity structure to form a continuous material crushing channel, and feeding the first-stage material through the second crushing cavity structure to obtain a second-stage material;

S3) selecting a third crushing cavity structure according to the material characteristics of the second-stage material, forming a multi-stage continuous material crushing channel by the third crushing cavity structure, the first crushing cavity structure and the second crushing cavity structure, and feeding the second-stage material through the third crushing cavity structure to obtain a crushed output material.

Specifically, the first crushing cavity structure has a first crushing cavity and a first lining plate structure, the second crushing cavity structure has a second crushing cavity and a second lining plate structure, the operation of nesting the second crushing cavity structure in the first crushing cavity structure to form the continuous material crushing channel in the step S2) comprises:

arranging a concave-convex structure on the working face of the first lining plate structure in the first crushing cavity structure, taking a part of the first lining plate structure arranged with the concave-convex structure as the second lining plate structure of the second crushing cavity structure and forming the second crushing cavity of the second crushing cavity structure, so that the second crushing cavity structure is nested in the first crushing cavity structure to form the continuous material crushing channel.

Specifically, the first lining plate structure comprises a fixed cone lining plate and a moving cone lining plate, the third crushing cavity structure has a third crushing cavity and a third lining plate structure. The operation of forming the multi-stage continuous material crushing channel by the third crushing cavity structure, the first crushing cavity structure and the second crushing cavity structure in the step S3) comprises:

forming the third lining plate structure of the third crushing cavity structure and forming the third crushing cavity by arranging concave wedge grooves in the parallel working face of the moving cone lining plate of the first crushing cavity structure, so that the third crushing cavity structure, the first crushing cavity structure and the second crushing cavity structure form the multi-stage continuous material crushing channel.

A method for designing a multi-stage nested material crushing cavity structure, comprising the following steps:

S1) selecting a first crushing cavity structure according to the material characteristics of an input material;

S2) selecting a second crushing cavity structure according to the material characteristics of a first-stage material obtained by the input material passing through the first crushing cavity structure, and nesting the second crushing cavity structure in the first crushing cavity structure to form a continuous material crushing channel;

S3) selecting a third crushing cavity structure according to the material characteristics of a second-stage material obtained by the first-stage material passing through the second crushing cavity structure, and forming a multi-stage continuous material crushing channel by the third crushing cavity structure, the first crushing cavity structure and the second crushing cavity structure.

Specifically, the first crushing cavity structure has a first crushing cavity and a first lining plate structure, the second crushing cavity structure has a second crushing cavity and a second lining plate structure, the operation of arranging the second crushing cavity structure in the first crushing cavity structure to form the continuous material crushing channel in the step S2) comprises:

arranging a concave-convex structure on the working face of the first lining plate structure in the first crushing cavity structure, taking a part of the first lining plate structure arranged with the concave-convex structure as the second lining plate structure of the second crushing cavity structure and forming the second crushing cavity of the second crushing cavity structure, so that the second crushing cavity structure is nested in the first crushing cavity structure to form the continuous material crushing channel.

Specifically, the first lining plate structure comprises a fixed cone lining plate and a moving cone lining plate, the third crushing cavity structure has a third crushing cavity and a third lining plate structure, the operation of forming the multi-stage continuous material crushing channel by the third crushing cavity structure, the first crushing cavity structure and the second crushing cavity structure in the step S3) comprises:

forming the third lining plate structure of the third crushing cavity structure and forming the third crushing cavity by arranging concave wedge grooves in the parallel working face of the moving cone lining plate of the first crushing cavity structure, so that the third crushing cavity structure, the first crushing cavity structure and the second crushing cavity structure form the multi-stage continuous material crushing channel.

A material crushing cavity structure based on dynamic cavity shapes, comprising:

a fixed cone lining body;

a moving cone lining body, comprising a rotating shaft, and a moving striker bar array that is connected with the rotating shaft and has a plurality of moving striker bars, wherein the moving striker bars of the moving striker bar array in the different rotation planes of the rotating shaft are parallel to each other, the maximum extension lengths of the moving striker bars vary from short to length from the moving striker bars in the rotation plane of the rotating shaft at the position of the input material to the moving striker bars in the rotation plane of the rotating shaft at the position of the crushed output material, and an envelope surface of the moving striker bar array for crushing the material forms a conical surface when all of the moving striker bars are in their maximum extension state;

wherein, the moving cone lining body and the fixed cone lining body form a material crushing channel that has a dynamic cavity shape.

Optionally, the rotating shaft comprises:

a programmable controller, with defined relative coordinates and maximum extension length of each moving striker bar;

a driver circuit configured to receive extension signals sent from the programmable controller for updating the current cavity shape of the material crushing channel;

a hydraulic unit configured to extend/retract each of the moving striker bars in the moving striker bar array, where the moving striker bar array is selectively driven by the driver circuit to extend/retract according to the extension signals;

wherein, the extension signals comprise relative coordinates and extension displacement vectors of the moving striker bars corresponding to the relative coordinates.

In another aspect, the present invention provides a multi-stage nested automatic material crushing apparatus, which comprises:

at least one processor; and a memory unit electrically connected to said at least one processor;

wherein, the memory unit stores commands that can be executed by said at least one processor, and said at least one processor implements the afore-mentioned method by executing the commands stored in the memory unit.

In yet another aspect, the present invention provides a computer-readable storage medium, which stores computer instructions that instruct the computer to execute the afore-mentioned method when they are executed in the computer.

With the above technical scheme, the present invention realizes a nested multi-gradient laminating crushing geometric cavity structure and a corresponding lining plate structure, so that materials in different particle diameters are subject to efficient laminating crushing in the crushing cavity at different height positions. The wearing rate of the lining plate is homogenized in the height direction of the crushing cavity. In addition, since the shape of the first-stage laminating crushing cavity is varied by the second-stage convex-concave crushing cavity and the third-stage wedge-shaped crushing cavity, the material crushing is changed from simple crushing to crushing, chopping, and shearing in combination, and thereby the crushing efficacy can be improved remarkably;

the present invention provides a novel solution and a novel method against material crushing problems, i.e., utilizes the crushing structure corresponding to the material characteristics in the current stage of the crushing process and the crushing structure in the previous stage to form an integral continuous material crushing channel, so as to realize an efficient material crushing process;

the present invention further utilizes nested first-stage and second-stage crushing cavity structures to remarkably improve the efficacy and utilization; besides, the nested concave-convex structure having a conical surface and the arc concave wedge grooves, which are introduced uniquely in the present application, can significantly reduce the abrasion of the crushing channel in the crushing cavity while accomplishing efficient material crushing;

furthermore, through engineering practice on the basis of the disclosure in the present invention, the technical schemes in the prior art can become specific embodiments of the present invention, and a multi-stage and/or nested crushing cavity structure in association with material characteristics can be realized. In addition, besides those specific embodiments, the present invention further implements unique engineering practice with the technical feature "a nested concave-convex structure having a conical surface and arc concave wedge grooves", and has characteristics of high performance and low abrasion.

Other features and advantages of the present invention will be further detailed in the embodiments hereunder.

DESCRIPTION OF REFERENCE NUMBERS

Figure 1:
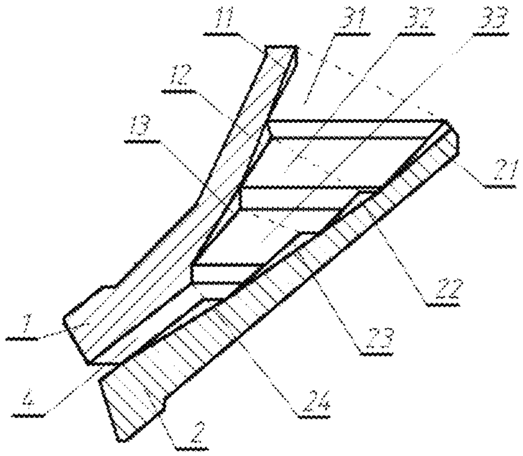
FIG. 1 is a schematic diagram of the nested multi-gradient laminating crushing geometric cavity shape of the material crushing cavity structure and the lining plate structure provided in the embodiments of the present invention.

1—fixed conical lining plate
11—second-stage laminating crushing cavity nested at the upper part of the fixed conical lining plate
12—second-stage laminating crushing cavity nested at the middle part of the fixed conical lining plate
13—second-stage laminating crushing cavity nested at the lower part of the fixed cone lining plate
2—moving cone lining plate
21—second-stage laminating crushing cavity nested at the upper part of the moving cone lining plate
22—second-stage laminating crushing cavity nested at the middle part of the moving cone lining plate
23—second-stage laminating crushing cavity nested at the lower part of the moving cone lining plate
24—third-stage laminating crushing cavity nested in the parallel area of the moving cone lining plate
31—upper area of the first-stage crushing cavity
32—middle area of the first-stage crushing cavity
33—lower area of the first-stage crushing cavity
4—parallel area

DETAILED DESCRIPTION OF THE EMBODIMENTS

Hereunder some embodiments of the present invention will be detailed with reference to the accompanying drawings. It should be understood that the embodiments described here are only provided to describe and explain the present invention, but shall not be deemed as constituting any limitation to the present invention.

Embodiment 1

The present invention provides a crushing cavity structure that is composed of crushing cavity structures different in size, shape and structure, and distribution position, which are combined according to specific requirements into a multi-stage nested laminating crushing geometric cavity shape. Thus, on one hand, all materials in different particle diameters are subject to laminating crushing; on the other hand, the crushing load is homogenized in the height direction of the crushing cavity, and thereby the crushing efficiency is improved and the service life of the lining plates is prolonged.

A material crushing cavity structure, comprising:

a material feed port configured to import an input material having a first material characteristic;

a first crushing cavity structure connected to the material feed port and configured for through-crushing the input material, wherein the first crushing cavity structure has a first crushing cavity and a first lining plate structure that match the first material characteristic and form a first-stage material crushing channel;

a second crushing cavity structure for through-crushing a first-stage material having a second material characteristic, wherein the first-stage material is obtained by the input material passing through the first-stage material crushing channel, the second crushing cavity structure has a second crushing cavity and a second lining plate structure that match the second material characteristic and form a second-stage material crushing channel;

wherein, the first-stage material crushing channel and the second-stage material crushing channel form a continuous material crushing channel.

(1) Design Method of First-Stage Laminating Crushing Cavity

The first lining plate structure of the first crushing cavity structure comprises a fixed cone lining plate 1 and a moving cone lining plate 2, and a first-stage laminating crushing cavity 3 and a parallel area 4 formed by the working faces of the fixed cone lining plate 1 and the moving cone lining plate 2.

The first-stage laminating crushing cavity 3 is composed of an upper laminating crushing cavity 31, a middle laminating crushing cavity 32, and a lower laminating crushing cavity 33 formed between corresponding steps on the fixed cone lining plate 1 and the moving cone lining plate 2.

The angles of engagement of the upper laminating crushing cavity 31, the middle laminating crushing cavity 32, and the lower laminating crushing cavity 33 shall meet the requirements for the laminating crushing cavity and the lining plate structure.

(2) Design Method of Second-Stage Laminating Crushing Cavity Structure

The regular conical working faces of the corresponding fixed cone lining plates and moving cone lining plates in different cavities of the first-stage crushing cavity are made into concave-convex conical surfaces. In the upper laminating crushing cavity 31, a second-stage laminating crushing cavity 11 is nested at the upper part of the fixed cone lining plate 1, and a second-stage laminating crushing cavity 21 is nested at the upper part of the moving cone lining plate 2. In the middle laminating crushing cavity 32, a second-stage laminating crushing cavity 12 is nested at the middle part of the fixed cone lining plate 1, and a second-stage laminating crushing cavity 22 is nested at the middle part of the moving cone lining plate 2. In the lower laminating crushing cavity 31, a second-stage laminating crushing cavity 13 is nested at the lower part of the fixed cone lining plate 1, and a second-stage laminating crushing cavity 23 is nested at the lower part of the moving cone lining plate 2.

The concave-convex conical surface 21 of the moving cone lining plate 2 has concave grooves 211 convex conical faces 212, wherein the width of the concave grooves 211 is constant in the direction of the generatrix of the conical surface. The depth of the concave grooves 211 varies from deep to shallow in the direction of the generatrix from top to bottom (the position of the input material is at the top, with respect to the material displacement direction). The symmetrical central plane of the concave grooves 211 is at a spiral angle α to the generatrix in the same longitudinal cross section, and the rotation direction of the helical angle α is the same as the rotation direction of the moving cone lining plate in the crushing process.

The convex conical faces between the grooves 211 in the conical surface 21 of the concave-convex moving cone lining plate are arranged in a spiral sector shape in the direction of the generatrix from top to bottom.

The conical surface 11 of the concave-convex fixed cone lining plate also have grooves 211 and convex conical faces 212. The width and depth of the grooves and their tendency of variation, and the size and rotation direction of the helical angle of the grooves are consistent with those on the concave-convex conical surface of the moving cone lining plate 21.

(3) Design Method of Third-Stage Wedge-Shaped Laminating Crushing Cavity Structure Several two-dimensional concave wedge grooves are uniformly distributed at an even angular interval on the working face of the moving cone lining plate 24 corresponding to the parallel area 4 (or material discharge port). The structure of the concave wedge groove consists of a linear wedge structure 241 in the direction of generatrix of the conical surface and an arc wedge structure 242 in the circumferential direction.

The depth of the linear wedge structure 241 of the concave wedge groove in the direction of generatrix of the conical surface of the moving cone lining plate 24 is gradually reduced from top to bottom;

the cross section of the arc wedge structure 242 of the concave wedge groove in the circumferential direction of the conical surface of the moving cone lining plate 24 consists of an outer arc section, a linear section, and an inner arc section. The depth of the arc wedge structure 242 is gradually reduced in the circumferential direction of the conical surface.

(4) Establishment of Multi-Scale Cohesive Particle Model of Irregularity Ore Based on 3D Scan Step 1: construction of geometric multi-scale particle model of irregular ore Before the crushing, the ore is scanned by 3D laser scanning, and a NURBS three-dimensional curved face geometric template is constructed for individual irregular ore particles with Geomagic Studio;

information of unit aggregates required for multi-scale model construction, such as the number, coordinates, and dimensions of the unit aggregates, etc., are obtained according to the particle shapes and particle diameters after the crushing, the 3D scanned NURBS curved face template is imported with a Particle Factory plugin, and a multi-scale geometric particle model of the irregular ore is reconstructed.

Step 2: Construction of mechanical multi-scale cohesion model of the ore

The intrinsic parameters, contact parameters, and BPM cohesion parameters of the particle model are determined according to the mechanical parameters (e.g., hardness and toughness, etc.) of the ore acquired in crushing experiments.

The normal stiffness, tangential stiffness, normal ultimate strength and tangential ultimate strength among the unit bodies in the model of individual ore particles are defined based on a BPM contact model.

Step 3: A multi-scale particle group/pile model of ore in different shapes is established by means of the multi-shape API plugin of EDEM Particle Factory, according to the established model of individual irregular multi-scale ore particles.

(5) Construction of Crushing Model and Simulation of Crushing Process

Step 1: first-stage, second-stage, and third-stage crushing cavity structures are established, and a three-dimensional model of fixed cone lining plate and moving cone lining plate is established; a multi-stage crushing cavity model is established according to the oscillation angle of the moving cone and the dimensions of the material discharge port, and the multi-scale particle group/pile model of irregular ore is filled into the crushing cavity.

Step 2: a physical model of material crushing process is established according to the rotation speed of the moving cone, and two-way coupling is performed with EDEM and ADAMS, to simulate the crushing process of the material in the multi-stage crushing cavity.

Step 3: the contact behaviors among unit bodies and particles are handled with a Hertz contact method, and the deformation of the particles is judged according to the linear displacement and angular displacement of units at different scales.

Step 4: the stress state in the particle model is calculated through contact analysis and external load analysis, crushing is started with the particle model when the stress state meets the maximum tensile-stress criterion and Mohr-Coulomb criterion, and the crushing with the particle model is described with the stress on the bonds among the unit bodies.

(6) Establishment of a Material Size-Grade Distribution Model in the Crushing Cavity Step 1: the influences of structural parameters of the crushing cavity (dimensions of the material feed port, dimensions of the material discharge port, and height of the crushing cavity), material size-grade distribution before crushing, rotation speed and oscillation angle of the moving cone, etc. on the size-grade distribution after crushing are analyzed.

Step 2: a size-grade distribution model in the crushing process is constructed with the following method:

1) The following size-grade mass balance model based on mass balance is utilized, i.e.:

$$P=(I-C)(I-BC)^{-1}f \tag{1}$$

Where, P—discharged material size-grade distribution vector, f—fed material size-grade distribution vector, B—crushing function matrix, C—grading function matrix, which is a diagonal matrix, I—identity matrix;

2) Determination of Crushing Matrix

The crushing matrix is a i×j matrix, where i represents the size grades of the mother material before crushing, and j represents the size grades of the child material after crushing. Each element in the crushing matrix is calculated with a continuous crushing function, and each element in the crushing functional matrix B can be determined according to formula (2), i.e.:

$$b_{mn}=\begin{cases}0, & m>n\\ 1-\varphi[d_m,(d_md_{n-1})], & m=n\\ \varphi\left[d_{m-1},(d_nd_{n-1})^{\frac{1}{2}}\right]-\varphi\left[d_m,(d_nd_{n-1})^{\frac{1}{2}}\right], & m<n\end{cases} \tag{2}$$

Where, m—average particle diameter (mm) of a material size grade in the size-grade distribution after crushing, n—average particle diameter (mm) of a material size grade in the size-grade distribution before crushing, $b_{mn}$—a crushing matrix calculation function, which represents the distribution (%) of particles at size grade $d_n$ in the mother material in the size grade $d_m$ after crushing, $d_m$—upper limit of a grading group in the child material, $d_{m-1}$—lower limit of a grading group in the child material, $d_n$—upper limit of a grading group in the mother material, $d_{n-1}$—lower limit of a grading group in the mother material, $\varphi(d_m,d_n)$—a crushing accumulation function, which represents the percentage of particles at size grade $d_n$ in the mother material in the particles is smaller than $d_m$ in the child material after crushing;

3) Determination of Grading Matrix

Supposing $d_1$ represents the critical size that determines whether a unit particle is to be crushed, the critical size that determines whether the particle is to be crushed in the crusher is determined by the size b of the material discharge port, i.e., $d_1$=s. Supposing $d_2$ represents the critical size that determines whether a unit particle can be crushed completely, the critical size that determines whether the particle can be crushed completely in the crusher is determined by the width L of the material feed port, the particles between $d_1$ and $d_2$ enter into the crushing process according to the grading function C(d). Supposing the grading function is a quadratic function and the curve gradient at $d_2$ is zero, the grading function may be expressed as:

$$C(d)=\begin{cases}0, & d<d_1\\ 1-\left(\frac{d_2-d}{d_2-d_1}\right)^2, & d_1<d<d_2\\ 1, & d_2<d\end{cases} \tag{3}$$

C(d) is a continuous grading function, but the material size-grade groups at specific height in the crushing cavity are discontinuous. Therefore, C*(d) may be used to represent the average value of the continuous function C(d) at granularity d. The following expression C*(d) can be derived from the above expression, i.e.:

$$C^*(d)=\begin{cases}d_1+\frac{d_2-d_1}{3}, & d<d1\\ d+\frac{d_2-d_1}{3}\left(\frac{d_2-d}{d_2-d_1}\right)^3, & d_1<d<d_2\\ d-d_2+\frac{d_2-d_1}{3}, & d_2<d\end{cases} \tag{4}$$

The continuous function $C_n$ (d) for material size grade between ($d_n$, $d_{n-1}$) may be expressed as:

$$C_n(d)=\frac{C^*(d_{n1})-C^*(d_n)}{d_{n1}-d_n} \tag{5}$$

4) Determination of Feed Material Size-Grade Vector f

The mother material is screened into i size grades before crushing, and thereby a i×1 fed material size-grade vector is established, and each element in that vector is the proportion of a size grade of material in the mother material, i.e.:

$$f=[f_1,f_2,f_3, \ldots f_m]^T \tag{6}$$

5) Determination of Size-Grade Distribution Vector P of Discharged Material

The size-grade distribution vector P after crushing is a j×1 vector, the crushed material is screened into j size grades, and the proportion of each size grade of material in the discharged material is the value of the corresponding element in the vector P.

The elements in the matrices B and C are determined through calculation, then the size-grade distribution vector f of the fed material is substituted into the matrices, so that the size-grade distribution of the discharged material from the crushing cavity structure corresponding to the size-grade distribution of the fed material is described with vector P.

(7) Structural and Dimensional Optimization of Multi-Stage Crushing Cavity

Step 1: the composition of grading fractions at different height positions in the multi-stage crushing cavity is calculated with the crushing function P, based on the movement trajectory of the particles in the crushing process;

Step 2: a target size grade of the discharged material after crushing is set;

Step 3: the calculated size grade of the discharged material from the multi-stage crushing cavity is compared with the target size grade. If the calculated size grade of the discharged material doesn't reach the target size grade, the shape and structure, angle of engagement, and length dimension of the crushing cavities in the stages are adjusted on the basis of the size-grade distribution in the multi-stage crushing cavity from top to bottom, till the requirement is met.

This embodiment has the following unique effects:

(1) The upper laminating crushing cavity is nested in the form of a convex-concave conical surface structure, the laminating crushing effect of the upper crushing cavity can be enhanced at the feeding capacity (especially in the case of full-cavity material feeding), and materials in different particle diameters can be crushed efficiently;

(2) The lower laminating crushing cavity is nested in the form of a multi-dimensional wedge-shaped groove structure, so that a material in large particle diameter can be fed easily into the wedge-shaped groove cavity, a favorable condition for effective crushing of a material in large particle diameter in the cavity is created. Thereby the crushing load and wearing in the parallel area can be reduced, and the size grade of the discharged material can be homogenized;

(3) With nested multi-gradient laminating crushing geometric cavity and lining plate structure, the material crushing is changed from simple crushing to crushing, chopping, and shearing in combination, and the effective utilization of crushing energy is improved. Moreover, the crushing load and the wearing rate of the lining plate are homogenized in the height direction of the crushing cavity, the service life of the lining plate is effectively prolonged, and the consistency of the crushing cavity shape is maintained;

(4) With an analytical method that incorporated crushing process simulation and crushing size-grade modeling, the structure and dimensions of the multi-stage crushing cavity are optimized, the rationality of the multi-stage crushing cavity structure can be improved remarkably, and the crushing cavity design is transited from empirical cut-and-trial design to accurate quantitative analysis and design.

Embodiment 2

Based on embodiment 1, furthermore:

1. The steps of design of the first-stage crushing cavity as shown in FIG. 1 are as follows:

(1) The working face of the fixed cone lining plate 1 consists of several steps and convex-concave inner conical surfaces between adjacent steps, wherein the quantity and height of the steps and the length of the conical surface between the steps are related with the size-grade distribution of the fed material and the crushing efficiency.

(2) The working face of the moving cone lining plate 2 consists of several steps and convex-concave outer conical surfaces between adjacent steps. The quantity and height of the steps and the spacing between the steps correspond to the quantity of the steps and the spacing between the steps on the working face of the fixed cone lining plate 1.

(3) Upper area 31, middle area 32, and lower area 33 of first-stage crushing cavity are formed between the steps on the working faces of the fixed cone lining plate 1 and the moving cone lining plate 2, and the angle of engagement of each crushing cavity doesn't exceed 25°.

Figure 2:
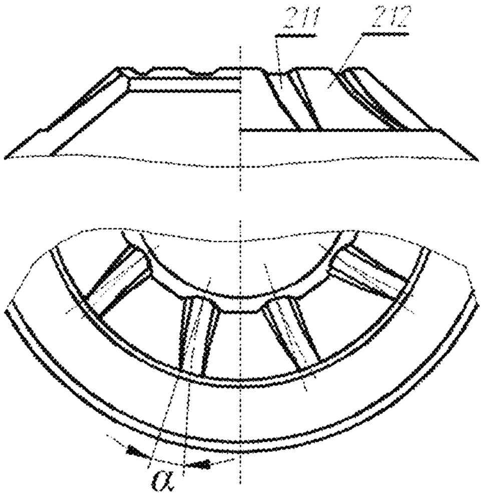
FIG. 2 is a schematic diagram of the second-stage concave-convex lining plate structure in the material crushing cavity structure provided in the embodiments of the present invention.

2. The steps of design of the second-stage convex-concave crushing cavity as shown in FIGS. 1 and 2 are as follows:

(1) Design of convexo-concave conical surface: a convex-concave conical surface formed by several arc-shaped beads and arc-shaped grooves arranged uniformly in alternate at an even angle is designed on the upper conical working face of the moving cone lining plate. Such a convex-concave conical surface may be in a regular shape formed by beads in a sinusoidal, rectangular or similar shape and grooves arranged in alternate, and the transition between the bead and the arc-shaped groove is smooth arc transition;

(2) Length design of convex-concave conical surface of moving cone lining plate: for the lining plate for coarse crushing, the length of the convex-concave conical surface in the direction of the generatrix is (0.5-1) times of the maximum size grade of the fed material; for the lining plate for medium crushing, the length of the convex-concave conical surface in the direction of the generatrix is (1-1.5) times of the maximum size grade of the fed material; for the lining plate for fine crushing, the length of the convex-concave conical surface in the direction of the generatrix is (1.5-2) times of the maximum size grade of the fed material.

(3) Groove depth design of convex-concave conical surface of moving cone lining plate: for the lining plates for coarse crushing, medium crushing and fine crushing, the depths of grooves at the top end of the convex-concave conical surface are not smaller than ⅕~⅓ of the maximum particle diameter of the fed material, and the depths of the grooves are gradually reduced to zero in the direction of the generatrix of the conical surface from top to bottom.

(4) Convex conical face design of convex-concave conical surface of moving cone lining plate: the areas between adjacent grooves are convex conical faces, which are arranged in a sector shape in the direction of the conical surface.

(5) Groove width design of convex-concave conical surface of moving cone lining plate: for the lining plates for coarse crushing, medium crushing and fine crushing, the groove widths corresponding to the peak positions on the convex-concave conical surface are ⅓~½ of the maximum particle diameter of the fed material.

(6) The shape design, length design, bead height or groove depth design, groove or bead width design of the convex-concave conical surface of the fixed cone lining plate are essentially the same as those of the convex-concave conical surface of the moving cone lining plate.

Figure 3:
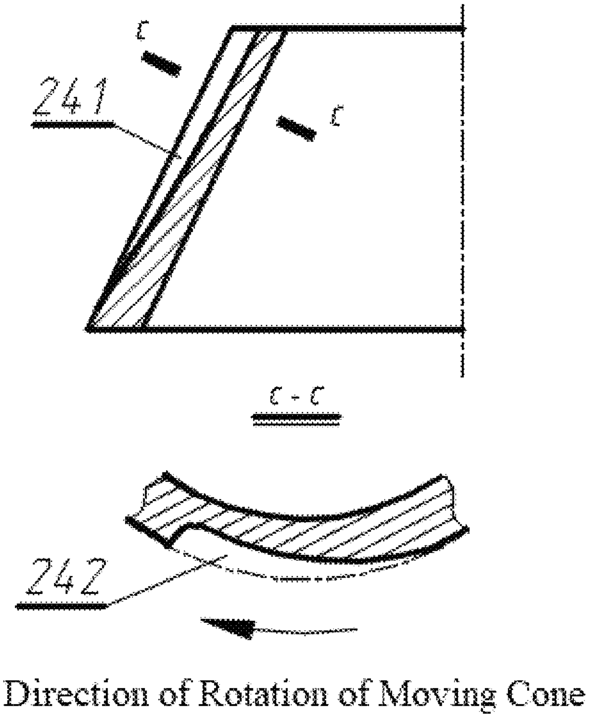
FIG. 3 is a schematic diagram of the third-stage wedge-shaped laminating crushing cavity structure in the material crushing cavity structure provided in the embodiments of the present invention.

3. The steps of design of the third-stage wedge-shaped crushing cavity as shown in FIG. 3 are as follows:

(1) Several concave wedge grooves 24 are designed in the direction of the generatrix of the conical working surface of the moving cone lining plate from top to bottom, and those concave wedge grooves are distributed along the conical working surface of the moving cone lining plate at an even angular interval;

(2) The quantity of the concave wedge grooves may be determined according to the maximum granularity in the crusher after crushing and the size of the bottom opening of the first-stage crushing cavity 33;

(3) The cross section of the concave wedge groove in the height direction is designed in a linear wedge shape 241, the maximum open end of the concave wedge groove is at the top plane of the moving cone lining plate, and the depth of the concave wedge groove is shallower at a position nearer the bottom;

(4) The cross-sectional shape of the concave wedge groove in the direction of the conical surface is designed as an arc wedge structure 242, and the trend of change of the bottom of the arc wedge groove from deep to shallow is consistent with the rotation direction of the moving cone in the crushing process;

(5) The depth of the bottom of the concave wedge groove at the top part shall not be smaller than the maximum particle diameter of the crushed product, and the depth of the bottom of the concave wedge groove at the bottom end shall be zero.

Figure 4:
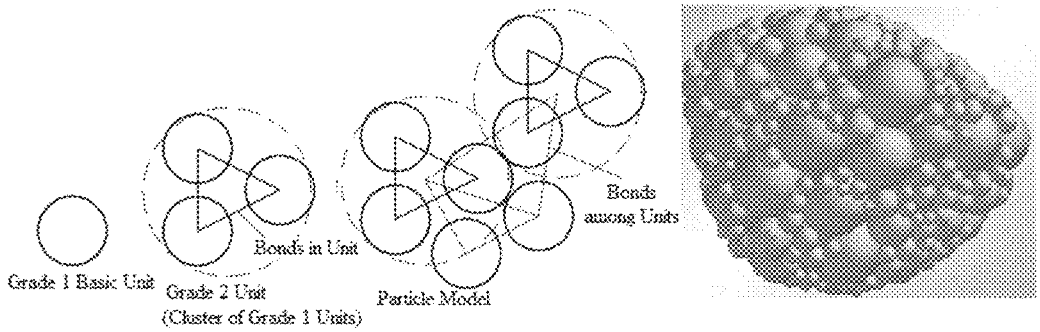
FIG. 4 is a schematic diagram of a multi-scale cohesive particle model.

4. The geometrical characteristics and mechanical characteristics of the multi-scale discrete particle model as shown in FIG. 4 are defined with the following method:

(1) The rigid basic unit bodies are bonded and aggregated by bonds. The mass and density of the basic unit bodies are the same as the physical parameters of the ore particles. The strength of the bonds represents the cohesion among the units, and is in line with the constitutive relation of elastic fracture, different strengths of bonds are used inside and outside units at different scales to define the magnitudes of cohesion;

(2) In the movement or crushing calculation process of the particle model, units at size grade 2 or greater scales are calculated integrally; the bonds among the units are broken first in the crushing process, and units at different scales are formed to represent the size-grade distribution;

(3) After the particle model only contain units at different scales (without bonds among the units, only the bonds in the units exist, and the unit at size grade 2 shown in FIG. 4 is turned into a model of one particle), the bonds in the unit bodies are broken when the crushing criterion is met. The crushing process is completed when all of the material is crushed into basic units at size grade 1, which have minimum particle diameter in the crushed material.

Figure 5:
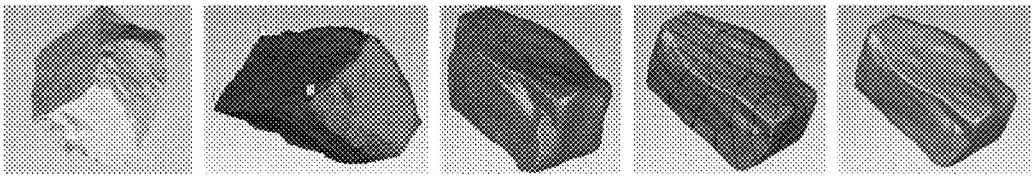
FIG. 5 is a schematic diagram of irregular multi-scale ore particle modeling.

5. Method and steps for generation of the irregular particle model as shown in FIG. 5:

(1) The overall geometric appearance of the ore is analyzed before the crushing, and it is ascertained that the irregular wolframite ore are in four typical shapes, i.e., spherical shape, conical shape, column shape, and flake shape. The four irregular shapes are scanned with a portable articulated arm measuring unit working with a Scanworks V5 laser scanning probe unit, and inverse modeling of the typical irregular ore shapes is accomplished with Geomagic Studio.

(2) The geometrical characteristic parameters of the three-dimensional geometrical body in front view, right view and top view are obtained, adjacent profiles are merged on the basis of key point information, external isolated points are removed, and data encapsulation is carried out, to form point cloud data of the irregular ore shapes (morphologies);

(3) Manifold points of irregularly ore shapes are created based on the point cloud data, non-manifold triangular data is deleted, the profiles are filled, the curve surfaces are patched automatically, and polygons are relaxed, so as to form polygonal grids on the profiles of the ore particles.

(4) The polygonal grids are dispersed into patches, and then the patches are fitted again into NURBS curve surfaces.

6. Embodiment of crushing size-grade distribution model

The material feed port of PYD1650 cone crusher is in diameter of 22~60 mm, the material discharge port is in diameter of 8 mm, the bottom elevation difference between the fixed cone lining plate and the moving cone lining plate is 100 mm, the height of the crushing cavity is 1,020 mm. The inclination angle of the fixed cone lining plate is 11°, the inclination angle of the moving cone lining plate is 16°. The bottom of the fixed cone lining plate is in diameter of 1,260 mm, the oscillation stroke of the moving cone lining plate is 23 mm, the distance from the moving cone suspension point to the cross section of the material discharge port is 1,540 mm, and the oscillation frequency of the moving cone is 125 r/min (1) Crushing Experiment Analysis The material in the experiment is copper ore, with Platts hardness coefficient within a range of 14~20, and the size grades of the fed material are shown in Table 1.

TABLE 1

Size-Grade Distribution of Fed Copper Ore

| | Particle diameter (mm) | | | | |
|---|---|---|---|---|---|
| | 45~60 | 30~45 | 20~30 | −20 | Σ |
| Weight (kg) | 18.5 | 32.2 | 13.7 | 27.5 | 91.9 |
| Percent (%) | 20.1 | 35.0 | 14.9 | 29.9 | 99.9 |

Through repeated sampling after crushing with a PYD1650 cone crusher, the average values of the size grades are shown in Table 2.

TABLE 2

Size-Grade Distribution of Crushed Copper Ore

| | Particle diameter (mm) | | | | |
|---|---|---|---|---|---|
| | +30 | 20~30 | 10~20 | −10 | Σ |
| Weight (kg) | 42.0 | 18.3 | 11.0 | 1.8 | 73.1 |
| Percent (%) | 57.5 | 25.0 | 15.0 | 2.5 | 100 |

(2) Derivation of Accumulative Crushing Function

Through size-grade data analysis and multi-parameter fitting after the crushing with PYD1650 cone crusher, the tendency of change from the particle diameter $t_2$ before crushing to different particle diameters $t_5$, $t_{10}$, $t_{28}$ and $t_{46}$ after crushing is obtained respectively, i.e.:

$$\begin{cases} t_2 = -0.0671t_5^2 + 3.9542t_5 + 7.8371 \\ t_2 = -0.1458t_{10}^2 + 5.3727t_{10} + 16.2751 \\ t_2 = -0.1616_{28}^2 + 4.2194t_{28} + 37.4644 \\ t_2 = -1.7053t_{46}^2 + 15.3092t_{46} + 31.6963 \end{cases} \quad (7)$$

Where, $t_n$ is the proportion of particles smaller than one $n^{th}$ of the overall particle size of the mother material in the material, and $t_2$ is the proportion of crushed material in particle diameter smaller than half of the particle diameter of the ore before crushing in the ore. n=5, 10, 28 and 46 according to the screening requirement.

The values of $t_5$, $t_{10}$, $t_{28}$ and $t_{46}$ in the child materials when $t_2$ is any value in the mother material can be calculated with formula (7). Based on the production experience, $t_2$ is determined as 60, 50 and 40 respectively, and is substituted into the above formula, and the values of $t_5$, $t_{10}$, $t_{28}$ and $t_{46}$ are calculated respectively; the relation between $t_2$ and $t_n$ is represented in a tabular form, i.e., an expression of accumulative crushing function, as shown in Table 3.

TABLE 3

Accumulative Crushing Function Derived from Experimental Data of Crushing

| Proportion of screenings in mother material | Proportion of screenings in child material (%) | | | |
|---|---|---|---|---|
| $t_2$ (%) | $t_5$ (0.2) | $t_{10}$ (0.1) | $t_{28}$ (0.036) | $t_{46}$ (0.022) |
| 40 | 11.5663 | 9.5643 | 4.0243 | 1.7957 |
| 50 | 13.7899 | 7.8663 | 3.5406 | 1.3168 |
| 60 | 22.9142 | 13.6321 | 7.8959 | 3.0920 |

The expressions of the accumulative crushing function when the proportions of particles $t_2$ in the mother material are 40%, 50% and 60% are obtained with a multi-parameter fitting method, as represented by formula (8), formula (9) and formula (10):

$$y==-4430.4414k^2+152.1523k-1.1397 \quad (8)$$

$$y=-131.2205k^2+96.6848k-0.3263 \quad (9)$$

$$y=-215.1213k^2+151.7548k+1.0862 \quad (10)$$

Wherein, formula (8)—accumulative crushing function when the proportion of the particles $t_2$ is 40% in the mother material; formula (9)—accumulative crushing function when the proportion of the particles $t_2$ is 50% in the mother material; formula (10)—accumulative crushing function when the proportion of the particles $t_2$ is 60% in the mother material.

Suppose the ratio of the overall geometric size x of particles of crushed child material at a size grade to the overall geometric size Y of the particles of the mother material is defined as K, i.e., K=x/Y; when the overall geometric size of the particles of the child material is x=1, K=1/n.

In the above three formulae, y represents the proportion of the screenings, and k represents the ratio of the particle diameter of the child material to the particle diameter of the mother material. After the accumulative crushing function is obtained, the corresponding proportion of the screenings for any value of K (i.e., K is any value) can be obtained. It may be expressed by $\varphi(d_m, d_n)$ as:

$$\varphi(d_m, d_n) = -443.4414\left(\frac{d_m}{d_n}\right)^2 + 152.1523\left(\frac{d_m}{d_n}\right) - 1.1397 \quad (11)$$

$$\varphi(d_m, d_n) = -131.2205\left(\frac{d_m}{d_n}\right)^2 + 96.6848\left(\frac{d_m}{d_n}\right) - 0.3263 \quad (12)$$

$$\varphi(d_m, d_n) = -215.1213\left(\frac{d_m}{d_n}\right)^2 + 151.7548\left(\frac{d_m}{d_n}\right) + 1.0862 \quad (13)$$

(2) Derivation of Crushing Matrix

The mother material is screened into four size grades −20 mm, 20 mm~30 mm, 30 mm~45 mm, and 45 mm~60 mm according to formula (12) on the basis of the actual situation of the experiment, and the crushed child material is screened into four size grades +15 mm, 10~15 mm, 5~10 mm, and −5 mm According to such size grading, the crushing matrix B is a 4×4 matrix, the rows of the matrix corresponding to the size grades of the mother material is expressed as j, and, starting from the first row, the rows correspond to −20 mm, 20 mm~30 mm, 30 mm~45 mm, and 45 mm~60 mm respectively. The columns of the matrix corresponding to the size grades of the child material are expressed as i, and, starting from the first column, the columns correspond to +15 mm, 10~15 mm, 5~10 mm, and −5 mm respectively.

The accumulative crushing function is $d_m/d'_n$, where $d_m$ is the upper limit of a size-grade group in the child material; $d'_n$ is the geometric average diameter of size-grade group n (i.e., $d'_n=\sqrt{d_n d_{n-1}}$, $d_n$ is the upper limit of particle diameter of the size-grade group in the mother material, $d_{n-1}$ is the lower limit of particle diameter of the size-grade group in the mother material).

According to the above definition, the $d_m/d_n$ corresponding to each element in the crushing matrix B can be calculated, and the calculation results of i/j are as follows:

$$\frac{i_1}{j_1} = 0.75,\ \frac{i_2}{j_1} = 0.50,\ \frac{i_3}{j_1} = 0.25,\ \frac{i_4}{j_1} = 0.15$$

$$\frac{i_1}{j_2} = 0.61,\ \frac{i_2}{j_2} = 0.41,\ \frac{i_3}{j_2} = 0.20,\ \frac{i_4}{j_2} = 0.12$$

$$\frac{i_1}{j_3} = 0.41,\ \frac{i_2}{j_3} = 0.27,\ \frac{i_3}{j_3} = 0.14,\ \frac{i_4}{j_3} = 0.08$$

$$\frac{i_1}{j_4} = 0.29,\ \frac{i_2}{j_4} = 0.19,\ \frac{i_3}{j_4} = 0.10,\ \frac{i_4}{j_4} = 0.06$$

Since the value $t_2$ in the mother material tends to be 50%, the value is substituted into the accumulative crushing function formula (12) to calculate the elements in the crushing matrix B sequentially. It is seen from the average particle diameters of the size grades of the mother material and the child material: the average particle diameter of each size grade of the child material is smaller than the average particle diameter of each size grade of the mother material. Therefore, each element in the crushing matrix is applicable to the situation of m<n, and the element $b_{mn}$ in the crushing matrix B can be calculated with i/j, i.e.:

$$b_{mn} = \begin{cases} 100 - \varphi\left(\frac{i_n}{j_m}\right), n = 1 \\ \phi\left(\frac{i_{n-1}}{j_m}\right) - \phi\left(\frac{i_n}{j_m}\right), n > 1 \end{cases} \quad (14)$$

The value i/j is substituted into the formula (12), and then the obtained result $\varphi(d_m,d_n)$ is calculated in the formula (14), to obtain the values of the elements in the matrix B. Thus, the crushing matrix B may be expressed as:

$$B=\begin{bmatrix}101.62 & -16.84 & -0.43 & 4.42\\ 90.18 & -7.43 & 3.49 & 4.38\\ 82.74 & 1.04 & 5.57 & 4.07\\ 83.32 & 3.37 & 5.28 & 3.03\end{bmatrix} \quad (15)$$

(3) Derivation of Size Grading Matrix

According to the dimension $d_1$=60 mm of the material feed port and the dimension $d_2$=8 mm of the material discharge port, in view that the mother material is graded into 0~20 mm, 20~30 mm, 30~45 mm, and 45~60 mm, in the calculation, 0, 20, 30, 45 and 60 are substituted into the formula (4), then:

$$C^*(1)=8+\frac{60-8}{3}=25.33,\text{ when } d=0;$$

$$C^*(2)=20+\frac{60-8}{3}\left(\frac{60-20}{60-8}\right)^3=27.91,\text{ when } d=20;$$

$$C^*(3)=30+\frac{60-8}{3}\left(\frac{60-30}{60-8}\right)^3=33.33,\text{ when } d=30;$$

$$C^*(4)=45+\frac{60-8}{3}\left(\frac{60-45}{60-8}\right)^3=45.42,\text{ when } d=45;$$

$$C^*(5)=60+\frac{60-8}{3}\left(\frac{60-60}{60-8}\right)^3=60,\text{ when } d=60;$$

The above calculation results are substituted into the formula $$C_n(d)=\frac{C^*(d_{n1})-C^*(d_n)}{d_{n-1}-d_n},$$

then:

$$C_1(d)=\frac{27.91-25.33}{20-0}=0.129$$

$$C_2(d)=\frac{33.33-27.91}{30-20}=0.542$$

$$C_3(d)=\frac{45.42-33.33}{45-30}=0.806$$

-continued $$C_4(d)=\frac{60-45.42}{60-45}=0.972$$

Therefore, the size grading matrix C is:

$$C=\begin{bmatrix}0.129 & & & \\ & 0.542 & & \\ & & 0.806 & \\ & & & 0.972\end{bmatrix} \quad (16)$$

According to the Table 1, the size-grade distribution function of the fed material may be expressed as:

$$f=[0.201\ 0.35\ 0.149\ 0.299] \quad (17)$$

Therefore, by substituting the formulae (15), (16) and (17) and identity matrix I into the formula (1), a size-grade distribution model of the discharged material in the case that the diameter of the material discharge port of the PYD1650 cone crusher is 8 mm and the maximum granularity of fed material is 60 mm can be obtained.

Figure 6:
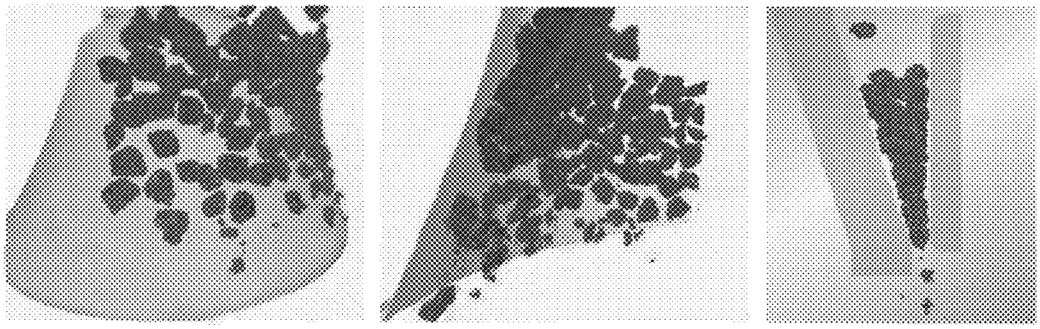
FIG. 6 is a schematic simulation diagram of the crushing process of the material crushing cavity structure provided in the embodiments of the present invention.

7. Simulation of crushing of irregular particles in a multi-stage crushing cavity through the following steps, as shown in FIG. 6:

(1) A three-dimensional model of the multi-stage crushing cavity structure of Model 1650 short head cone crusher is established, and is imported into EDEM;

(2) Secondary development is carried out with VC++, and the above crushing function is imported into EDEM;

(3) The irregular particle model established on the basis of the size-grade distribution of the ore before crushing is imported into the multi-stage crushing cavity structure. After the rotation speed and yaw angle of the moving cone, EDEM and ADMS interface software are utilized and crushing force is applied to the particle model in the crushing cavity in the precession and nutation process of the moving cone. The particles are crushed when the crushing force exceeds the cohesion in the particle model.

8. Crushing effect of the multi-stage crushing cavity

The width of the granularity controller of a pre-grinding tester is set to 3 mm, and the length of the granularity controller is set to 20 mm; the result obtained through calculation with the size-grade distribution model of discharged material and result obtained in the pre-grinding experiment are shown in Table 4.

TABLE 4

Comparison between Calculation Result and Experimental Result of Granularity of Discharged Material

| | +2.362 mm | | | 0.701~2.362 mm | | | 0.254~0.701 mm | | | −0.254 mm | | |
|---|---|---|---|---|---|---|---|---|---|---|---|---|
| Experimental group | Experimental value (%) | Calculated value (%) | Relative error (%) | Experimental value (%) | Calculated value (%) | Relative error (%) | Experimental value (%) | Calculated value (%) | Relative error (%) | Experimental value (%) | Calculated value (%) | Relative error (%) |
| Scheme 1 | 36.3 | 36.8 | 1.4 | 38.7 | 34.2 | 11.6 | 8.9 | 10.0 | 12.3 | 16.1 | 15.0 | 6.8 |
| Scheme 2 | 35.6 | 36.8 | 3.4 | 41.1 | 38.9 | 5.4 | 10.2 | 10.1 | 1.0 | 13.1 | 11.6 | 11.5 |
| Scheme 3 | 39.6 | 41.7 | 5.3 | 37.3 | 34.1 | 8.6 | 10.0 | 9.9 | 1.0 | 13.1 | 11.5 | 12.2 |

It is seen from the above table: the calculation result and the experimental result match each other well for the size grades corresponding to most experimental groups; but the fluctuation of relative errors is severe for the size grades corresponding to some experimental groups.

The research findings described above can set a basis for establishment of size-grade distribution model of crushed particle groups and multi-parameter crushing energy consumption analysis of relevant particle groups in the project.

In the aspect of efficient crushing performance study, efficient crushing cavity design for crushers can be carried out with a multi-objective optimization method, mainly employing crushing yield and size reduction ratio as optimization objectives and employing parameters such as ore hardness, granularity before/after crushing, and structure of crushing cavity, etc. as constraints. Compared with ordinary crushing cavities, by utilizing the optimized crushing cavity, the proportion of particles at satisfactory granularity in the crushed product can be increased by 10% or more, the crushing yield can be improved by 20%~40% or more, and the service life of the lining plate can be improved by 1~2 times. Therefore, the crushing cavity optimization and modeling and the solution method provide a reference for this technique.

While some preferred embodiments of the present invention are described above with reference to the accompanying drawings, the embodiments of the present invention are not limited to the details in those preferred embodiments. Various simple modifications and variations be made to the technical schemes of the embodiments of the present invention without departing from the technical concept of the embodiments of the present invention. However, all these simple modifications and variations shall be deemed as falling in the scope of protection of the embodiments of the present invention.

In addition, it should be noted that the specific technical features described in above embodiments may be combined in any appropriate form, provided that there is no conflict. To avoid unnecessary iteration, such possible combinations are not described here in the present invention.

Those skilled in the art can understand that all or a part of the steps constituting the method in the above-mentioned embodiments can be implemented by instructing relevant hardware with a program, which is stored in a storage medium and includes a number of instructions to instruct a single-chip microcomputer, a chipset, or a processor, etc. to execute all or a part of the steps of the method described in the embodiments of the present application. The above-mentioned storage medium may include: U-disk, removable hard disk, Read-Only Memory (ROM), Random Access Memory (RAM), diskette, or CD-ROM, or a similar medium that can store program codes.

Moreover, different embodiments of the present invention may be combined freely as required, as long as the combinations don't deviate from the ideal and spirit of the embodiments of the present invention. However, such combinations shall also be deemed as falling in the scope disclosed by the embodiments of the present invention.

The invention claimed is:

1. A material crushing cavity structure, comprising:

a first crushing cavity structure for passing through an input material having a first material characteristic, the first crushing cavity structure has a first crushing cavity and a first lining plate structure that match the first material characteristic, and the first crushing cavity and the first lining plate structure form a first-stage material crushing channel, wherein, the first lining plate structure comprises a fixed cone lining plate and a moving cone lining plate, the working faces of the fixed cone lining plate and the moving cone lining plate are stepped curve faces, so that the first crushing cavity forms a first-stage laminating crushing cavity;

a second crushing cavity structure for passing through a first-stage material having a second material characteristic, the first-stage material is obtained by the input material passing through the first-stage material crushing channel, the second crushing cavity structure has a second crushing cavity and a second lining plate structure that match the second material characteristic, and the second crushing cavity and the second lining plate structure form a second-stage material crushing channel, wherein, the second lining plate structure comprises a concave-convex lining plate structure formed by arranging concave-convex structures on the working faces of the fixed cone lining plate and the moving cone lining plate in the first crushing cavity, so that the second lining plate structure is nested in the first lining plate structure to form a second-stage laminating crushing cavity;

wherein, the first-stage material crushing channel and the second-stage material crushing channel form a continuous material crushing channel.

2. The material crushing cavity structure of claim 1, further comprising:

a third crushing cavity structure for passing through a second-stage material having a third material characteristic to obtain a crushed output material, the second-stage material is obtained by the first-stage material passing through the second-stage material crushing channel, the third crushing cavity structure has a third crushing cavity and a third lining plate structure that match the third material characteristic, and the third crushing cavity and the third lining plate structure form a third-stage material crushing channel;

wherein, the third-stage material crushing channel and the continuous material crushing channel form a multi-stage continuous material crushing channel.

3. The material crushing cavity structure of claim 2, wherein, the second lining plate structure and the third lining plate structure are arranged with the first lining plate structure sequentially, and form a multi-stage nested crushing cavity structure together with the first lining plate structure, any one of the second crushing cavity and the third crushing cavity is different from the first crushing cavity in terms of the cavity size, and the second crushing cavity and the third crushing cavity are different from each other in terms of the cavity size.

4. The material crushing cavity structure of claim 3, wherein, the working faces of the fixed cone lining plate and the moving cone lining plate form an upper laminating crushing cavity, a middle laminating crushing cavity, and a lower laminating crushing cavity, the sizes of which are reduced sequentially, with respect to the position of the input material;

the upper laminating crushing cavity, the middle laminating crushing cavity, and the lower laminating crushing cavity form the first crushing cavity.

5. The material crushing cavity structure of claim 4, wherein, the third lining plate structure comprises:

concave wedge grooves arranged on a parallel working face of the moving cone lining plate relative to the fixed cone lining plate.

6. The material crushing cavity structure of claim 4, wherein, the concave-convex lining plate structure forms an upper nested second-stage laminating crushing cavity, a middle nested second-stage laminating crushing cavity, and a lower nested second-stage laminating crushing cavity, the sizes of which are reduced sequentially, corresponding to the upper laminating crushing cavity, the middle laminating crushing cavity, and the lower laminating crushing cavity;

the upper nested second-stage laminating crushing cavity, the middle nested second-stage laminating crushing cavity, and the lower nested second-stage laminating crushing cavity form the second crushing cavity.

7. The material crushing cavity structure of claim 6, wherein, the concave-convex structure comprises:

concave grooves, which extend along the generatrix of the conical surface of the fixed cone lining plate or the moving cone lining plate, and have constant groove width;

convex cones, which are arranged in alternate with the concave grooves;

wherein the groove depth of the concave grooves varies from deep to shallow with respect to the working faces of the convex cones along the displacement vector direction of the input material;

wherein in the longitudinal cross section of a selected moving cone lining plate or fixed cone lining plate, the symmetrical central planes of the concave grooves are at a spiral angle with respect to the generatrix of the conical surface of the current lining plate, the rotation direction of the spiral angle is the same as the rotation direction of the moving cone lining plate;

wherein the working faces of the convex cones are arranged in a spiral sector shape along the displacement vector direction of the input material.

8. A method for designing a multi-stage nested material crushing cavity structure, comprising the following steps:

S1) selecting a first crushing cavity structure according to the material characteristics of an input material, wherein, the first crushing cavity structure has a first crushing cavity and a first lining plate structure, the first lining plate structure comprises a fixed cone lining plate and a moving cone lining plate, working faces of the fixed cone lining plate and the moving cone lining plate are stepped curve faces, so that the first crushing cavity forms a first-stage laminating crushing cavity;

S2) selecting a second crushing cavity structure according to the material characteristics of a first-stage material obtained by the input material passing through the first crushing cavity structure, and nesting the second crushing cavity structure in the first crushing cavity structure to form a continuous material crushing channel, wherein, the second crushing cavity structure has a second lining plate structure, the second lining plate structure comprises a concave-convex lining plate structure formed by arranging concave-convex structures on the working faces of the fixed cone lining plate and the moving cone lining plate in the first crushing cavity, so that the second lining plate structure is nested in the first lining plate structure to form a second-stage laminating crushing cavity;

S3) selecting a third crushing cavity structure according to the material characteristics of a second-stage material obtained by the first-stage material passing through the second crushing cavity structure, and forming a multi-stage continuous material crushing channel by the third crushing cavity structure, the first crushing cavity structure and the second crushing cavity structure.

9. The method of claim 8, wherein, the second crushing cavity structure has a second crushing cavity, and the operation of arranging the second crushing cavity structure in the first crushing cavity structure to form the continuous material crushing channel in the step S2) comprises:

arranging a concave-convex structure on the working face of the first lining plate structure in the first crushing cavity structure, taking a part of the first lining plate structure arranged with the concave-convex structure as the second lining plate structure of the second crushing cavity structure and forming the second crushing cavity of the second crushing cavity structure, so that the second crushing cavity structure is nested in the first crushing cavity structure to form the continuous material crashing channel.

10. The method of claim 9, wherein, the third crushing cavity structure has a third crushing cavity and a third lining plate structure, and the operation of forming the multi-stage continuous material crushing channel by the third crushing cavity structure, the first crushing cavity structure and the second crushing cavity structure in the step S3) comprises:

forming the third lining plate structure of the third crushing cavity structure and forming the third crushing cavity by arranging concave wedge grooves in the parallel working face of the moving cone lining plate of the first crushing cavity structure, so that the third crushing cavity structure, the first crushing cavity structure and the second crushing cavity structure form the multi-stage continuous material crushing channel.

* * * * *